United States Patent
Yow et al.

(10) Patent No.: US 9,196,576 B2
(45) Date of Patent: Nov. 24, 2015

(54) SEMICONDUCTOR PACKAGE WITH STRESS RELIEF AND HEAT SPREADER

(71) Applicants: Kai Yun Yow, Petaling Jaya (MY); Poh Leng Eu, Petaling Jaya (MY); Meng Kong Lye, Shah Alam (MY); You Ge, Tianjin (CN); Penglin Mei, Tianjin (CN)

(72) Inventors: Kai Yun Yow, Petaling Jaya (MY); Poh Leng Eu, Petaling Jaya (MY); Meng Kong Lye, Shah Alam (MY); You Ge, Tianjin (CN); Penglin Mei, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/277,801

(22) Filed: May 15, 2014

(65) Prior Publication Data

US 2015/0084169 A1    Mar. 26, 2015

(30) Foreign Application Priority Data

Sep. 25, 2013  (CN) .......................... 2013 1 0680113

(51) Int. Cl.
*H01L 23/495* (2006.01)
*H01L 23/34* (2006.01)

(52) U.S. Cl.
CPC .... *H01L 23/49568* (2013.01); *H01L 23/49503* (2013.01); *H01L 23/49551* (2013.01); *H01L 2224/48091* (2013.01); *H01L 2224/48247* (2013.01); *H01L 2224/48471* (2013.01)

(58) Field of Classification Search
CPC .............. H01L 23/49568; H01L 23/34; H01L 23/49503; H01L 23/4952; H01L 23/49575
See application file for complete search history.

(56) References Cited

U.S. PATENT DOCUMENTS

| | | | |
|---|---|---|---|
| 4,289,922 A | 9/1981 | Devlin | |
| 4,298,883 A * | 11/1981 | Komatsu | H01L 23/3107 257/667 |
| 5,053,855 A * | 10/1991 | Michii | H01L 23/4334 257/675 |
| 5,327,008 A | 7/1994 | Djennas | |
| 5,424,576 A | 6/1995 | Djennas | |
| 6,046,496 A * | 4/2000 | Corisis | H01L 23/4334 257/675 |
| 6,617,200 B2 | 9/2003 | Sone | |
| 6,661,087 B2 | 12/2003 | Wu | |
| 7,315,077 B2 | 1/2008 | Choi | |
| 8,383,962 B2 | 2/2013 | Sutardja | |
| 2008/0283978 A1* | 11/2008 | Aripin | H01L 23/4334 257/670 |
| 2010/0244214 A1* | 9/2010 | Arita | H01L 23/3107 257/676 |
| 2011/0204498 A1 | 8/2011 | Au | |

* cited by examiner

*Primary Examiner* — Peniel M Gumedzoe
(74) *Attorney, Agent, or Firm* — Charles Bergere

(57) ABSTRACT

A semiconductor device has a die mounted on a die paddle that is elevated above and thermally connected via tie bars to a heat sink structure. Heat generated by the die flows from the die to the die paddle to the tie bars to the heat sink structure and then to either the external environment or to an external heat sink. By elevating the die/paddle sub-assembly above the heat sink structure, the packaged device is less susceptible to delamination between the die and die attach adhesive and/or the die attach adhesive and the die paddle. An optional heat sink ring can surround the die paddle.

7 Claims, 9 Drawing Sheets

(B)

(A)

SEMICONDUCTOR PACKAGE WITH STRESS RELIEF AND HEAT SPREADER

BACKGROUND OF THE INVENTION

The present invention relates generally to packaged semiconductor devices and, more particularly, to techniques for relieving stress in semiconductor sensor devices.

In conventional packaged semiconductor devices, dies are typically mounted, using epoxy or other suitable adhesive, directly on die paddles, which, when configured for use, may themselves be connected directly to external heat sinks designed to conduct heat away from the heat-generating dies. Such configurations can induce mechanical stresses to the paddles and dies potentially resulting in undesirable de-lamination of the interface between the die and the epoxy and/or undesirable de-lamination of the interface between the epoxy and the paddle. If the weak adhesion between the epoxy and the die/paddle is addressed, the mechanical stresses can shift from the epoxy to the die itself, resulting in mechanical failure (e.g., cracks) in the die.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

One embodiment of the invention is an article of manufacture comprising a lead frame for a packaged semiconductor device. The lead frame comprises a heat sink structure defining a first plane; a die paddle defining a second plane substantially parallel to the first plane and displaced from the first plane; a plurality of tie bars physically and thermally interconnecting the heat sink structure and the die paddle to form a heat sink/paddle sub-assembly; and a plurality of leads positioned adjacent to the heat sink/paddle sub-assembly.

Another embodiment of the invention is a method for assembling an article of manufacture and the resulting article. A die is die-bonded onto a die paddle of a lead frame, wherein the lead frame comprises a heat sink structure defining a first plane; the die paddle defining a second plane substantially parallel to the first plane and displaced from the first plane; a plurality of tie bars physically and thermally interconnecting the heat sink structure and the die paddle to form a heat sink/paddle sub-assembly; and a plurality of leads positioned adjacent to the heat sink/paddle sub-assembly. The die is wire bonded to one or more of the leads using one or more corresponding bond wires. Mold compound is applied to encapsulate the die and the one or more bond wires, wherein a portion of the heat sink structure and a portion of each lead are exposed.

Figure 1:
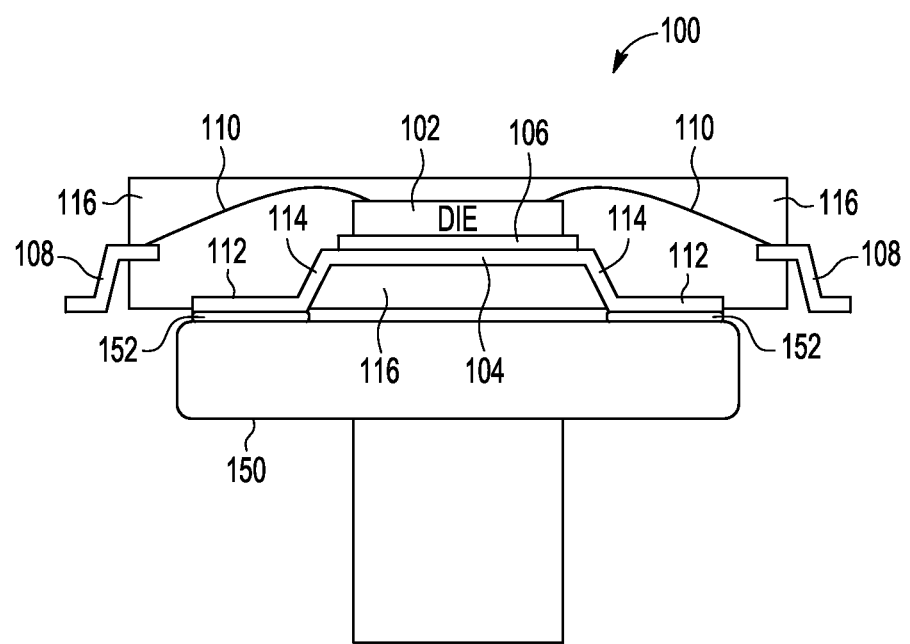
FIG. 1 shows a cross-sectional side view of a packaged semiconductor device mounted on an external heat sink in accordance with an embodiment of the invention.

FIG. 1 shows a cross-sectional side view of a packaged semiconductor device 100 mounted on an external heat sink 150 in accordance with an embodiment of the invention. The packaged device 100 has a die 102 die-bonded to a die paddle 104 with a die-attach adhesive 106 and wire bonded to a plurality of leads 108 with bond wires 110. The die paddle 104 is connected to a heat sink ring 112 by multiple tie bars 114. The die 102, die paddle 104, bond wires 110, and tie bars 114 are encapsulated and the leads 108 and heat sink ring 112 are embedded all within an electrically insulating mold compound 116 to form the QFP (quad flat pack) packaged semiconductor device 100 having leads that extend beyond the lateral dimensions of the mold compound 116.

Those skilled in the art will understand that alternative embodiments of the invention include QFN (quad flat no-lead) packaged semiconductor devices whose leads do not extend beyond the lateral dimensions of the mold compound. Further alternative embodiments include (without limitation) ball grid array (BGA) packages, molded array packages (MAP), and other leaded packages.

Whether the packaged device is a QFP device or a QFN device or some other type of device, at least some surface of each lead 108 is exposed (i.e., not completely encapsulated within the mold compound 116). Similarly, as viewed in FIG. 1, the bottom surface of the heat sink ring 112 is also exposed.

Conventional, the electrically insulating die-attach adhesive 106 may be used to attach the die 102 to the die paddle 104. Those skilled in the art will understand that suitable alternative means, such as die-attach tape, may be used. The leads 108 may be formed of copper, an alloy of copper, a copper plated iron/nickel alloy, plated aluminum, or the like. Often, copper leads are pre-plated first with a nickel base layer, then a palladium mid layer, and finally with a very thin, gold upper layer. The bond wires 110 are formed from a conductive material such as aluminium, silver, gold, or copper, and may be either coated or uncoated. The mold compound 116 may be a plastic, an epoxy, a silica-filled resin, a ceramic, a halide-free material, the like, or combinations thereof, is known in the art.

As shown in FIG. 1, the heat sink ring 112 lies in a first plane at the bottom of the packaged device 100, while the die paddle 104 lies in a second plane substantially parallel to and displaced above the first plane, with the tie bars 114 providing down steps between the die paddle 104 and the heat sink ring 112. Similarly, each lead 108 provides a down step (middle section) from an upper or inner lead portion lying in the second plane to a lower or outer lead portion lying in the first plane. Depending on the particular implementation, the leads 108 may have any suitable shape, such as "gull wing" or J-shaped.

In the configuration of FIG. 1, the packaged device 100 is mounted on an external heat sink 150 using thermally conductive solder 152. In operation, heat generated within the die 102 is thermally conducted from the die 102 to the die paddle 104 via the adhesive 106, from the die paddle 104 to the heat sink ring 112 via the tie bars 114, and from the heat sink ring 112 to the heat sink 150 via the solder 152. Thus, in this embodiment, the heat sink ring 112 forms a heat sink structure that is part of the thermal path between the die paddle 104 and the external heat sink 150.

In a conventional packaged semiconductor device, the die paddle would lie in the first plane such that, when configured for use, the die paddle would be in direct or at least relatively close thermal contact with a heat sink such as heat sink 150. In the configuration shown in FIG. 1, however, the die paddle 104 lies in the second plane, such that the die 102 and the die paddle 104 are displaced from the first plane and therefore from the heat sink 150. As a result, the mechanical stresses in configurations of conventional packaged devices that result from the close thermal contact with a heat sink are eliminated or at least reduced in the configuration of FIG. 1. As a result, the corresponding undesirable de-laminations of the prior art can be avoided.

Figure 2:
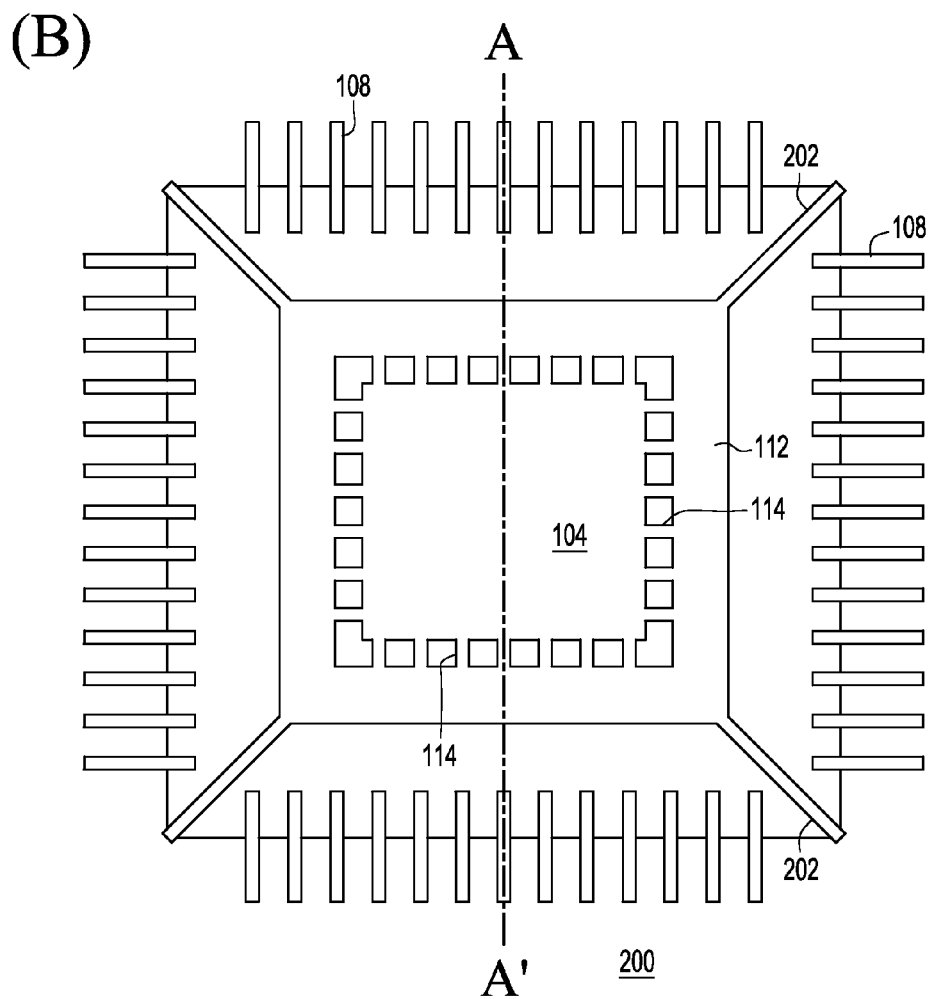
FIGS. 2(A)-2(B) illustrate a step in a process for assembling a packaged semiconductor device in accordance with an embodiment of the present invention.
Figure 2:
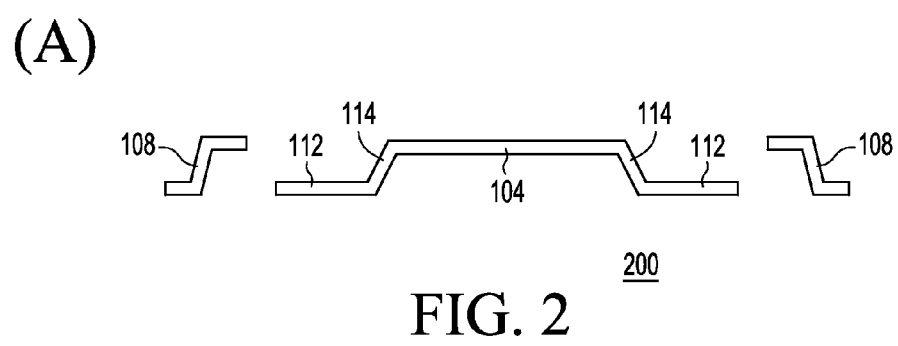
Figure 3:
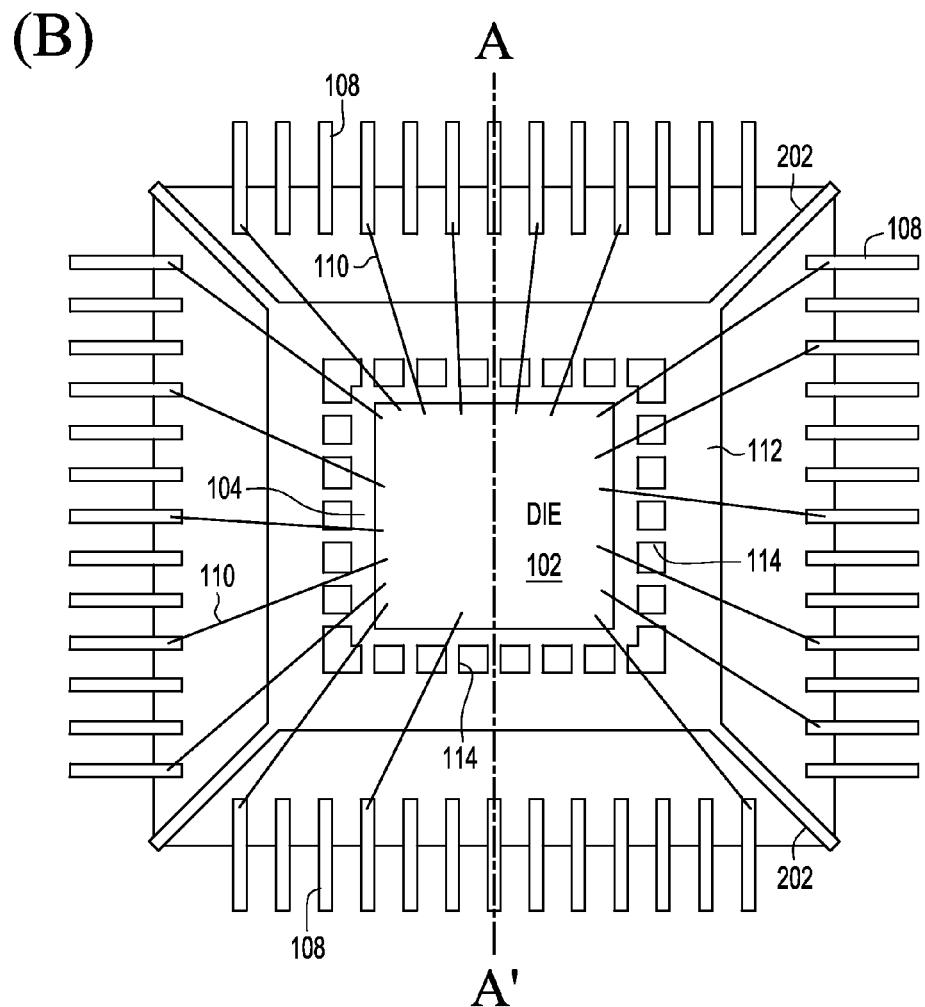
FIGS. 3(A)-3(B) illustrate a step in a process for assembling a packaged semiconductor device in accordance with an embodiment of the present invention.
Figure 3:
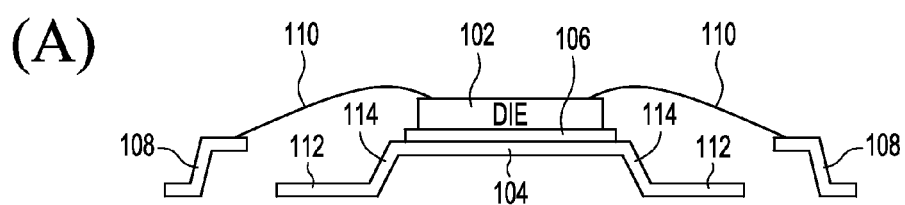
Figure 4:
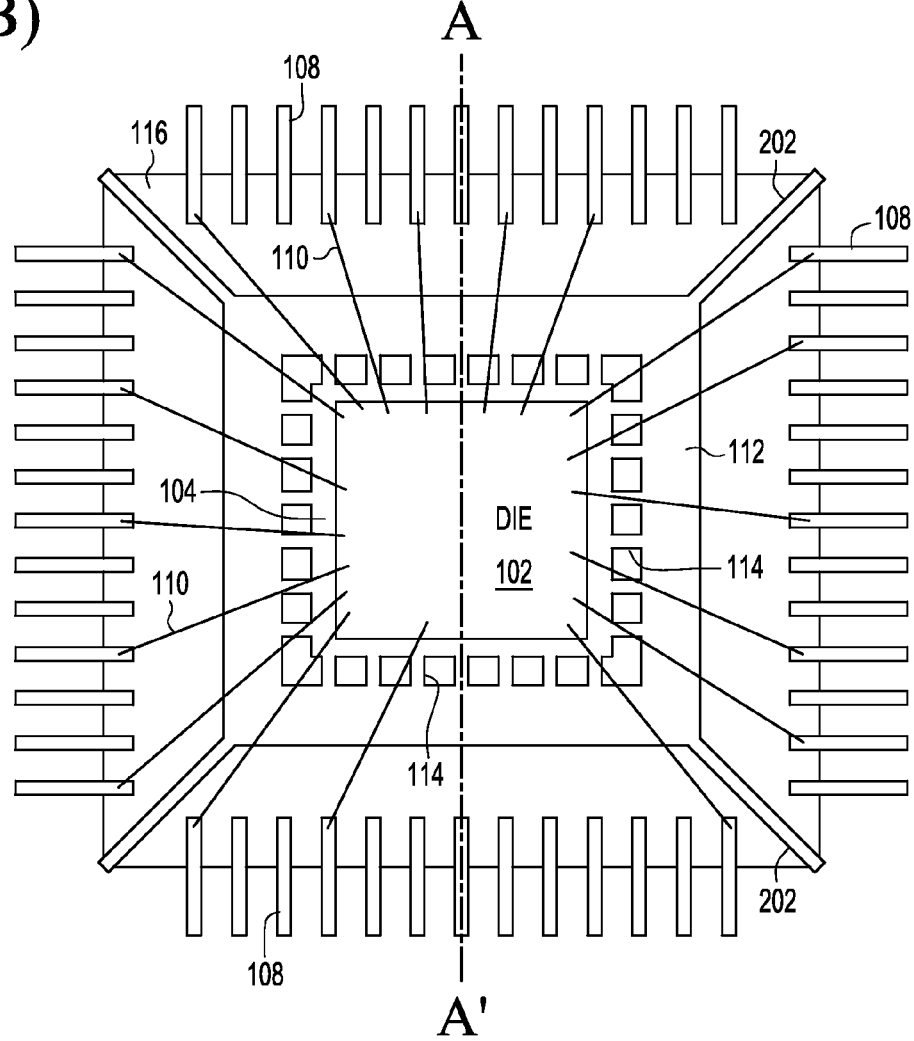
FIGS. 4(A)-4(C) illustrate a step in a process for assembling a packaged semiconductor device in accordance with an embodiment of the present invention.
Figure 4:
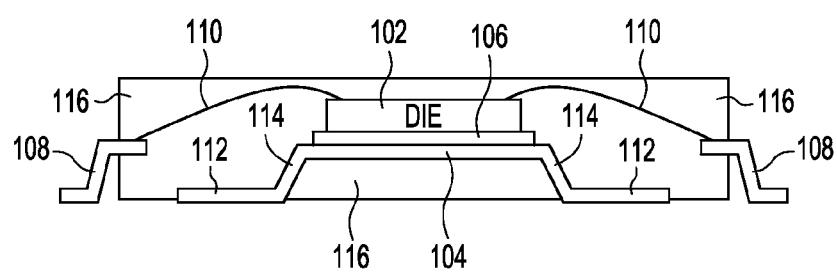
Figure 4:
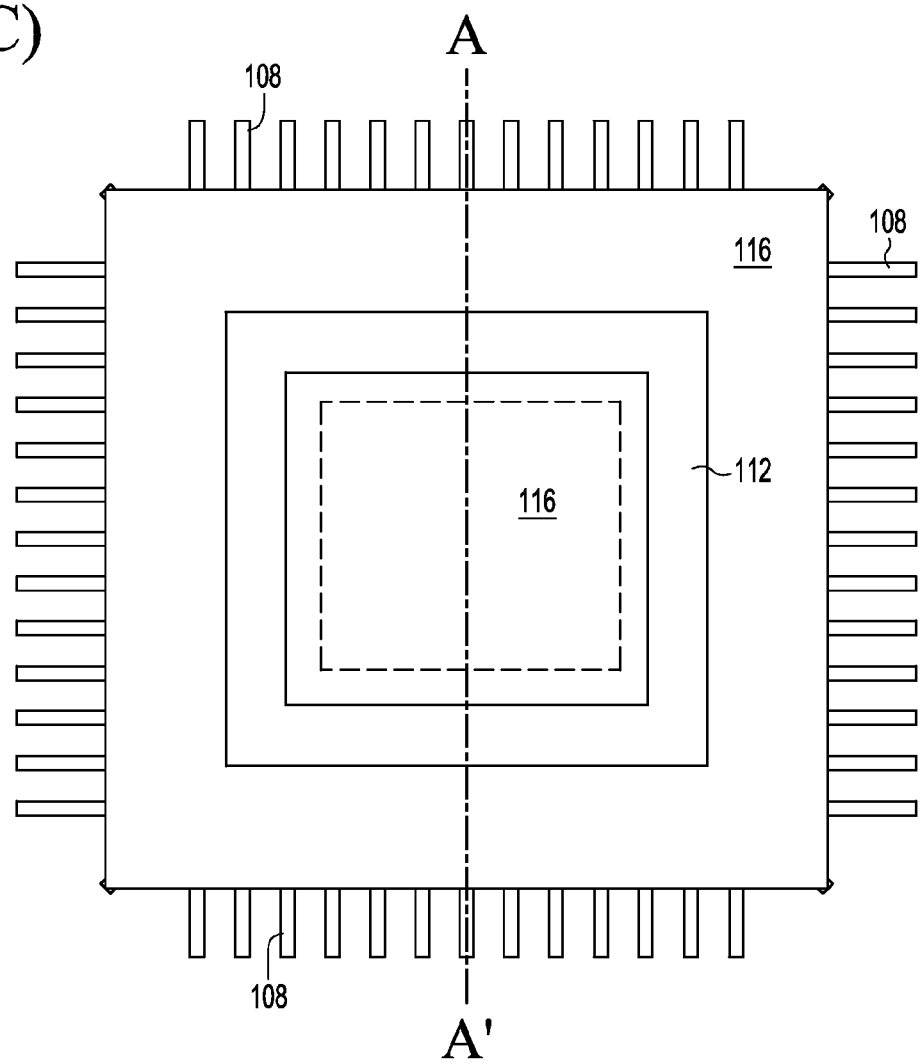

FIGS. 2-4 illustrate one possible process for assembling packaged semiconductor device 100 of FIG. 1.

FIGS. 2(A) and 2(B) show a cross-sectional side view and a top plan view, respectively, of a lead frame 200 comprising the die paddle 104, the leads 108, the heat sink ring 112, and the tie bars 114 of FIG. 1. Note that the lead frame 200 is an un-embedded lead frame whose elements are not yet embedded in mold compound. As such, those elements need to be suitably supported prior to subsequent application of mold compound during an encapsulation phase of the assembly process (described below with respect to FIG. 4).

Those skilled in the art will understand that a two-dimensional array of different instances of the packaged device 100 of FIG. 1 are assembled using a lead-frame assembly consisting of a two-dimensional array of instances of the lead frame 200 of FIG. 2, where, except for the outermost leads of the lead-frame assembly, each lead 108 is part of a lead structure in the lead-frame assembly that includes a corresponding lead for the adjacent instance of the lead frame 200. At the end of the assembly process, the individual packaged devices 100 are separated during a saw or laser singulation step in which each lead structure is sliced into two leads 108, one for each of two different instances of the packaged device 100. The leads may then be appropriately shaped (e.g., gull wing or J) for the particular implementation.

As shown in FIG. 2(B), the lead frame 200 also includes four support bars 202 which provide mechanical support for each sub-assembly consisting of the die paddle 104, heat sink ring 112, and tie bars 114 in the two-dimensional lead-frame assembly prior to application of the mold compound 116.

Although not shown in the figures, the support bars 202 also have down steps analogous to those of the leads 108.

FIGS. 3(A) and 3(B) show a cross-sectional side view and a top plan view, respectively, of the lead frame 200 of FIG. 2 after the die 102 has been (i) die-bonded to the die paddle 104 using the adhesive 106 and (ii) wire bonded to the leads 108 using the bond wires 110.

FIGS. 4(A), 4(B), and 4(C) show a cross-sectional side view, an X-ray top plan view, and a bottom plan view, respectively, of the assembly of FIG. 3 after the mold compound 116 has been applied to (i) encapsulate the die 102, die paddle 104, bond wires 110, and tie bars 114 and (ii) embed the leads 108 and heat sink ring 112, leaving exposed the ends of the leads 108 and the bottom of the heat sink ring 112.

One way of applying the molding compound 116 is using a mold insert of a conventional injection-molding machine, as is known in the art. The molding material is typically applied as a liquid polymer, which is then heated to form a solid by curing in a UV or ambient atmosphere. The molding material can also be a solid that is heated to form a liquid for application and then cooled to form a solid mold. Subsequently, an oven is used to cure the molding material to complete the cross linking of the polymer. As known in the art, the mold compound 116 may be applied using a dam bar design on the leads, where any excess mold compound is later removed using a suitable de-junking process. In alternative embodiments, other encapsulating processes may be used.

Note that this implementation involves a single application of mold compound. In an alternative implementation, the lead frame 200 is pre-molded prior to the die-bonding and wire bonding of FIG. 3, in which case the corresponding encapsulation step of FIG. 4 would involve the application of the mold compound 116 on top of the pre-molded lead frame.

FIGS. 5(A)-5(D) show respectively a 3D perspective view, a top view, a bottom view, and a partial side view of the leads 502, the die paddle 504, and the four pads 506 of a lead frame for a packaged semiconductor device 500 according to an alternative embodiment of the invention. As shown in the figures, the die paddle 504 has two intersecting arms that form an X shape, while the four pads 506 are all triangular in shape.

Figure 5A:
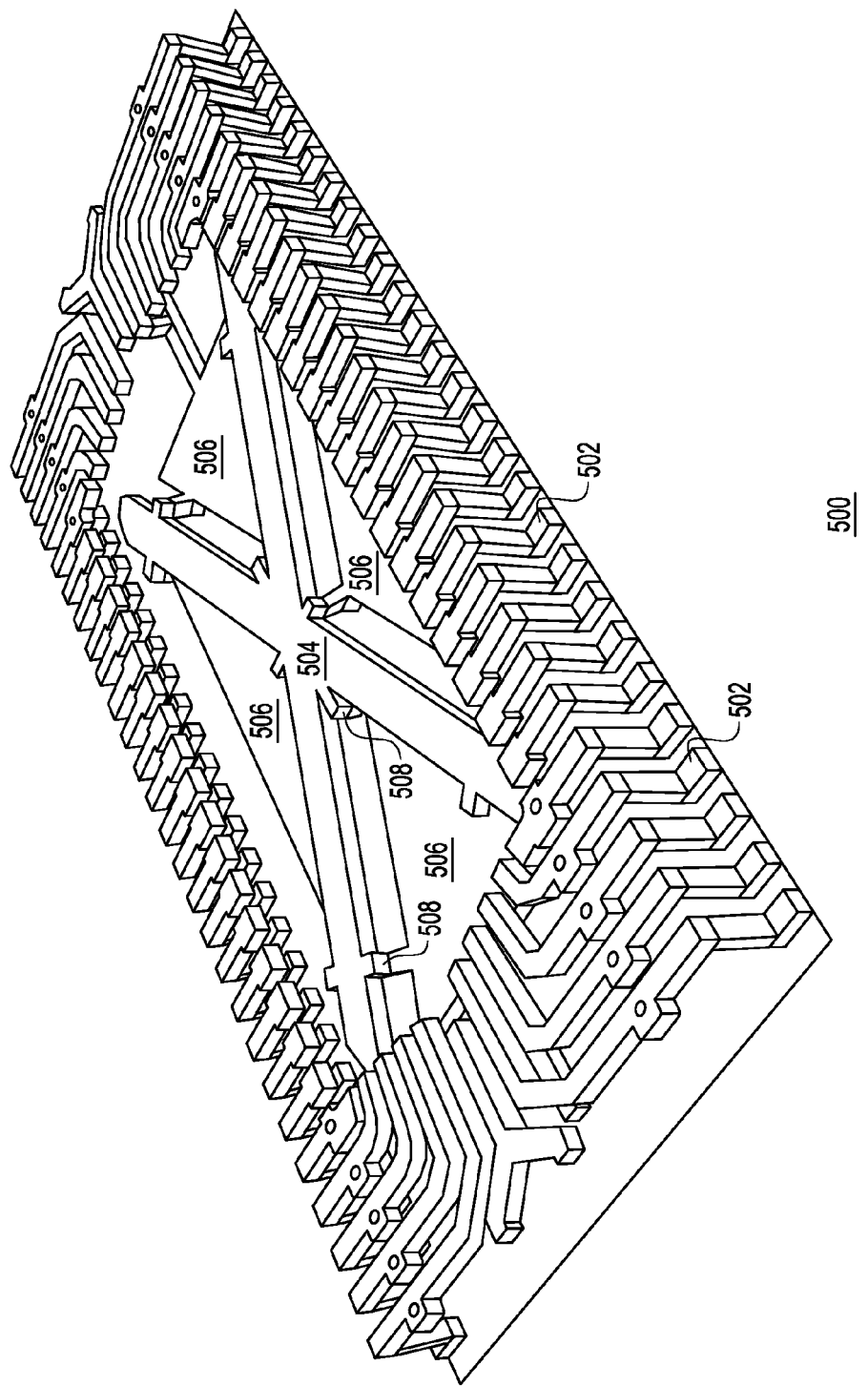
FIGS. 5(A)-5(D) show respectively a perspective view, a top view, a bottom view, and a partial side view of a lead frame for a packaged semiconductor device according to an alternative embodiment of the present invention.
Figure 5B:
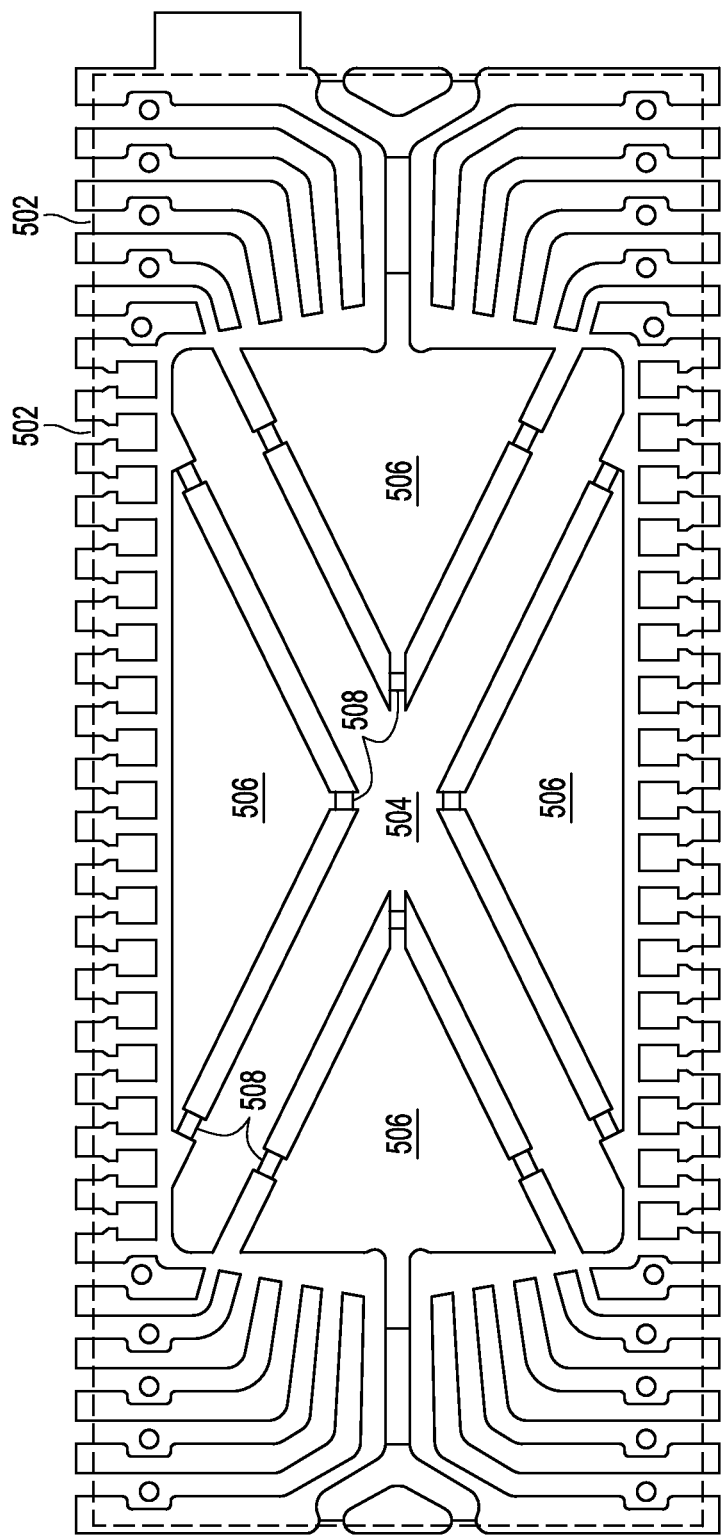
Figure 5C:
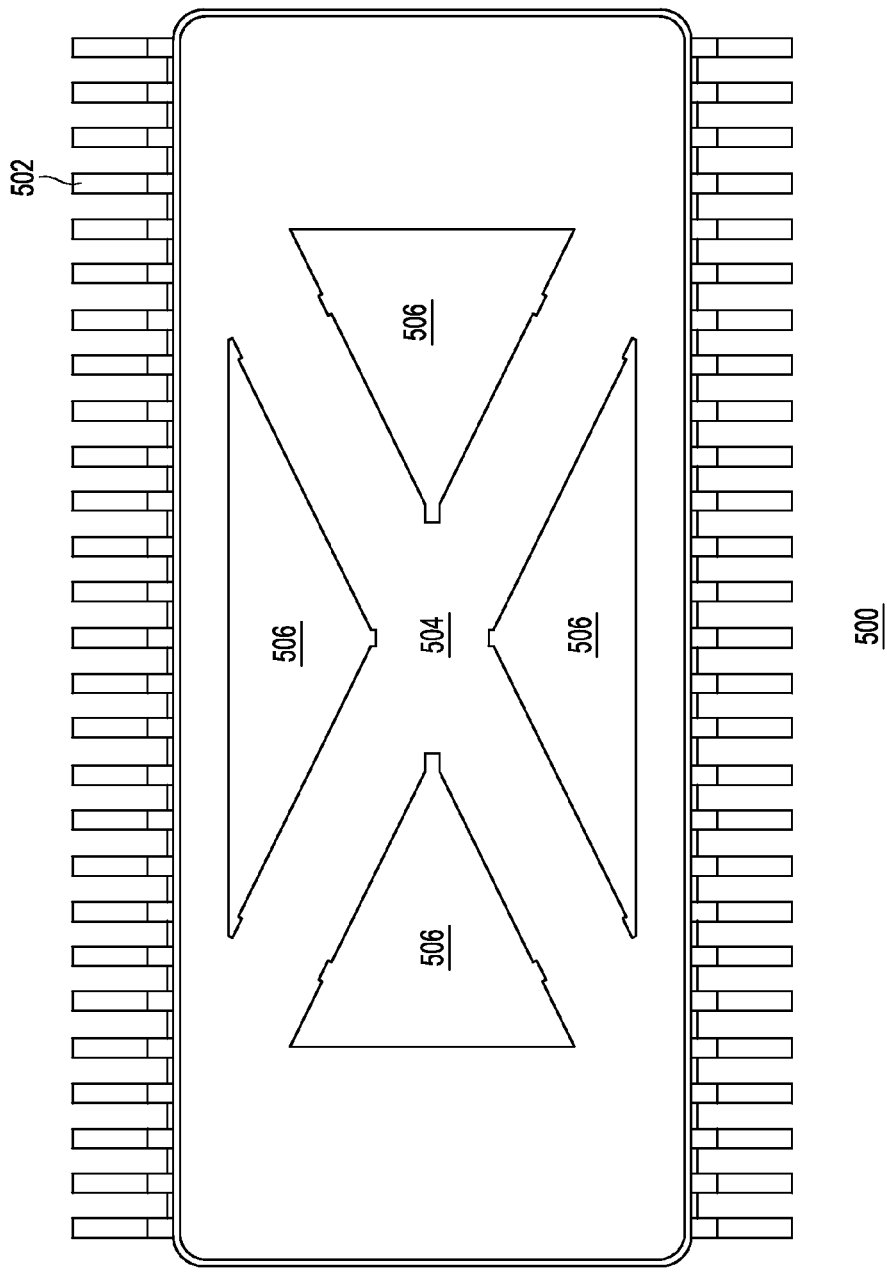
Figure 5D:
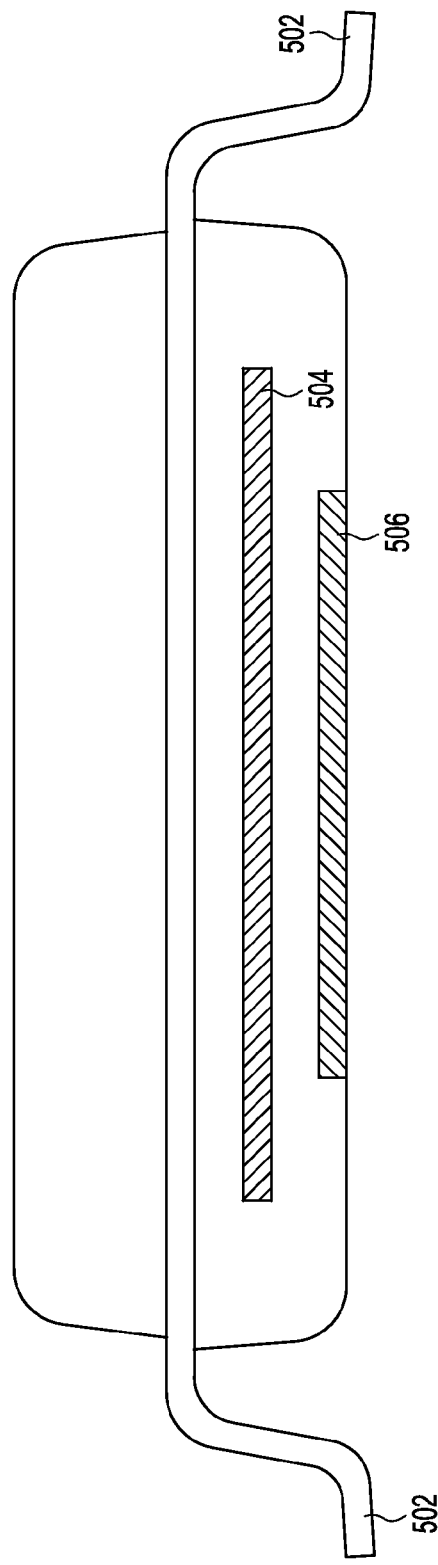

As shown in FIG. 5(D), the four pads 506 lie in a first plane at the bottom of the packaged device 500, while the die paddle 504 lies in a second plane substantially parallel to and displaced above the first plane, with multiple tie bars 508 providing down steps between the die paddle 504 and the four pads 506. Similarly, each lead 502 provides a down step from an upper lead portion to a lower lead portion. In the particular implementation of FIG. 5, the leads 502 are "gull wing" shaped.

In the configuration of FIG. 5, the packaged device 500 could be mounted on an external heat sink using thermally conductive solder in a manner analogous to that shown in FIG. 1. In operation, heat generated within the die or dies (not shown) mounted on the die paddle 504 would be thermally conducted from the die(s) to the die paddle 504 via the adhesive used to secure the die(s) to the die paddle 504, from the die paddle 504 to the four pads 506 via the 12 tie bars 508, and from the four pads 506 to the external heat sink (not shown) via the solder used to secure the packaged device 500 to the external heat sink. Thus, in this embodiment, the four pads 506 form a heat sink structure that is part of the thermal path between the die paddle 504 and the external heat sink.

As described previously, in a conventional packaged semiconductor device, the die paddle would lie in the first plane such that, when configured for use, the die paddle would be in direct or at least relatively close thermal contact with an external heat sink such as heat sink 150. In the configuration shown in FIG. 5, however, the die paddle 504 lies in the second plane, such that the die(s) and the die paddle 504 are displaced from the first plane and therefore from the external heat sink. As a result, the mechanical stresses in configurations of conventional packaged devices that result from the close thermal contact with a heat sink are eliminated or at least reduced in the configuration of FIG. 5. As a result, the corresponding undesirable de-laminations of the prior art can be avoided.

As used herein, the term "mounted on" as in "a first die mounted on a die paddle" covers situations in which the first die is mounted directly on the die paddle with no other intervening dies or other structures (as in the mounting of the die 102 on the die paddle 104 in FIG. 3) as well as situations in which the first die is directly mounted on another die, which is itself mounted directly on the die paddle. Note that "mounted on" also covers situations in which there are two or more intervening dies between the first die and the die paddle. Depending on the situation, the term "mounted" can imply electrical connection in addition to physical attachment, where the electrical connection may be provided by one or more bond wires, one or more solder bumps, and/or any other suitable technique.

By now it should be appreciated that there has been provided an improved packaged semiconductor device and a method of forming the improved packaged semiconductor device. Circuit details are not disclosed because knowledge thereof is not required for a complete understanding of the invention.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

The invention claimed is:

1. A lead frame for a packaged semiconductor device, the lead frame comprising:
   a heat sink structure defining a first plane;
   a die paddle defining a second plane substantially parallel to and spaced from the first plane, wherein the die paddle comprises two intersecting arms forming an X-shape having four triangular openings, and the heat sink structure comprises four triangular pads corresponding to the four triangular openings in the X-shaped die paddle;
   a plurality of tie bars physically and thermally interconnecting the heat sink structure and the die paddle to form a heat sink/paddle sub-assembly, wherein the tie bars connect the die paddle to the heat sink structure at a plurality of locations along the X-shaped die paddle, and wherein the tie bars comprise:
      a first plurality of tie bars located at a periphery of the two intersecting arms; and
      a second plurality of tie bars located at an intersection of the two intersecting arms; and
   a plurality of leads positioned adjacent to the heat sink/paddle sub-assembly.

2. The lead frame of claim 1, wherein each tie bar comprises a down step between the second plane and the first plane.

3. The lead frame of claim 1, wherein:
   the leads have an outer end located in the first plane, an inner end located in the second plane, and a middle section that extends between and connects the inner and outer ends.

4. A packaged semiconductor device, comprising:
   a lead frame including,
      a heat sink structure defining a first plane,
      a die paddle defining a second plane substantially parallel to and spaced from the first plane, wherein the die paddle comprises two intersecting arms forming an X-shape having four triangular openings, and the heat sink structure comprises four triangular pads corresponding to the four triangular openings in the X-shaped die paddle,
      a plurality of tie bars physically and thermally interconnecting the heat sink structure and the die paddle to form a heat sink/paddle sub-assembly, wherein the tie bars connect the die paddle to the heat sink structure at a plurality of locations along the die paddle, and wherein the tie bars comprise:
    a first plurality of tie bars located at a periphery of the two intersecting arms; and
    a second plurality of tie bars located at an intersection of the two intersecting arms, and
a plurality of leads positioned adjacent to the heat sink/paddle sub-assembly;
a die mounted on the die paddle;
bond wires electrically connecting the die to corresponding ones of the leads; and
mold compound encapsulating the die and the bond wires and at least a portion of the lead frame, wherein a portion of the heat sink structure and a portion of each lead are exposed.

5. The packaged semiconductor device of claim 4, further comprising:
a heat sink connected to the exposed portion of the heat sink structure.

6. The packaged semiconductor device of claim 4, wherein the leads have an outer end located in the first plane, an inner end located in the second plane, and a middle section that extends between and connects the inner and outer ends.

7. The packaged semiconductor device of claim 4, wherein each tie bar comprises a down step between the second plane and the first plane.

\* \* \* \* \*